United States Patent
Herard et al.

(10) Patent No.: US 10,147,834 B2
(45) Date of Patent: Dec. 4, 2018

(54) OVERMOLD PROXIMITY SENSOR AND ASSOCIATED METHODS

(71) Applicant: STMICROELECTRONICS PTE LTD, Singapore (SG)

(72) Inventors: Laurent Herard, River Place (SG); David Gani, Choa Chu Kang (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 3 days.

(21) Appl. No.: 14/885,215

(22) Filed: Oct. 16, 2015

(65) Prior Publication Data

US 2017/0110618 A1 Apr. 20, 2017

(51) Int. Cl.
| | |
|---|---|
| *H01L 31/167* | (2006.01) |
| *H01L 25/16* | (2006.01) |
| *H01L 31/18* | (2006.01) |
| *H01L 31/0203* | (2014.01) |
| *H01L 33/00* | (2010.01) |
| *H01L 33/58* | (2010.01) |
| *G01S 17/02* | (2006.01) |

(Continued)

(52) U.S. Cl.
CPC ............ *H01L 31/167* (2013.01); *G01S 7/481* (2013.01); *G01S 17/026* (2013.01); *H01L 25/167* (2013.01); *H01L 31/0203* (2013.01); *H01L 31/16* (2013.01); *H01L 31/18* (2013.01); *H01L 33/005* (2013.01); *H01L 33/58* (2013.01); *G01D 5/34715* (2013.01); *G01S 7/4813* (2013.01); *H01L 33/54* (2013.01); *H01L 2224/16225* (2013.01); *H01L 2924/00* (2013.01); *H01L 2924/15151* (2013.01); *H01L 2924/1815* (2013.01); *H01L 2933/005* (2013.01); *H01L 2933/0058* (2013.01)

(58) Field of Classification Search
CPC ...... G01S 7/4813; G01S 7/481; G01S 17/026; G01D 5/34715; H01L 31/167; H01L 31/0203; H01L 31/18; H01L 33/005; H01L 33/54; H01L 33/58; H01L 2933/005; H01L 2933/0058; H01L 31/16; H01L 33/00; H01L 2924/00; H01L 2924/1815; H01L 25/167
USPC .......................................................... 257/83
See application file for complete search history.

(56) References Cited

U.S. PATENT DOCUMENTS

| | | | | |
|---|---|---|---|---|
| 2006/0016970 A1* | 1/2006 | Nagasaka | ............... | G01D 5/305 |
| | | | | 250/231.13 |
| 2010/0314532 A1* | 12/2010 | Chin | .................. | G01D 5/34715 |
| | | | | 250/231.13 |

(Continued)

FOREIGN PATENT DOCUMENTS

| | | |
|---|---|---|
| CN | 1727850 A | 2/2006 |
| CN | 101936752 A | 1/2011 |

(Continued)

*Primary Examiner* — Stephen Bradley
*Assistant Examiner* — Patricia Reddington
(74) *Attorney, Agent, or Firm* — Slater Matsil, LLP

(57) ABSTRACT

An electronic device includes a substrate, an optical sensor coupled to the substrate, and an optical emitter coupled to the substrate. A lens is aligned with the optical emitter and includes an upper surface and an encapsulation bleed stop groove around the upper surface. An encapsulation material is coupled to the substrate and includes first and second encapsulation openings therethrough aligned with the optical sensor and the lens, respectively.

23 Claims, 2 Drawing Sheets

(51) Int. Cl.
*H01L 31/16* (2006.01)
*G01S 7/481* (2006.01)
*G01D 5/347* (2006.01)
*H01L 33/54* (2010.01)

(56) References Cited

U.S. PATENT DOCUMENTS

| | | | |
|---|---|---|---|
| 2012/0290255 A1* | 11/2012 | Kelkar | H01L 25/167 |
| | | | 702/150 |
| 2013/0009173 A1* | 1/2013 | Vittu | G01S 7/4813 |
| | | | 257/82 |
| 2014/0021491 A1 | 1/2014 | Meng et al. | |
| 2015/0028360 A1 | 1/2015 | Tu et al. | |

FOREIGN PATENT DOCUMENTS

| | | |
|---|---|---|
| CN | 103400836 A | 11/2013 |
| CN | 205406519 U | 7/2016 |
| WO | 2007091761 A1 | 8/2007 |

* cited by examiner

OVERMOLD PROXIMITY SENSOR AND ASSOCIATED METHODS

FIELD

The present invention relates to the field of proximity sensors, and, more particularly, to an overmold proximity sensor and associated methods.

BACKGROUND

Proximity sensors typically have isolation between an optical detector and an optical emitter to function properly. One approach is an electronic package that includes a substrate, a first integrated circuit provided with the optical detector, and a second integrated circuit provided with the optical emitter, with these two integrated circuits being secured onto the substrate. An opaque cover is bonded onto the substrate to optically isolate each of the integrated circuits by virtue of the existence of separate chambers. The cover may have two separate openings, formed facing the two abovementioned optical elements and provided with transparent protection plates.

This known electronic package for a proximity sensor uses a substrate and the fabrication of the specially dimensioned cover, involves numerous mounting steps and external electrical connection difficulties regarding the integrated circuits, and has large dimensions compared to the size of the integrated circuits.

Another approach uses molding in the fabrication of the proximity sensor, which is considered low, cost but the lens dome shape is generally required to be flush or lower than a top of the final electronic package of the proximity sensor in order to protect the lens during handling or a mounting process. In addition, the molding process requires a flat surface but the lens dome shape will prevent this while there is a need to prevent the lens from being contaminated with black molding parts as well.

SUMMARY

An electronic device may include a substrate, an optical sensor coupled to the substrate, an optical emitter coupled to the substrate, and a lens aligned with the optical emitter. The lens may include an upper surface and an encapsulation bleed stop groove around the upper surface. In addition, encapsulation material may be coupled to the substrate with the encapsulation material having first and second encapsulation openings therethrough, which are aligned with the optical sensor and the lens, respectively.

In a particular embodiment, an electronic device may include a circuit board having first and second faces and first and second board openings therethrough. An integrated circuit (IC) may be coupled to the first face of the circuit board and include first and second optical receiving areas aligned with the spaced apart first and second openings, respectively. In addition, an encapsulation material may be coupled to the second face of the circuit board and include first and second encapsulation openings therethrough that are aligned with the first and second board openings, respectively. A lens may be secured within the second board opening and second encapsulation opening and have a curved upper surface and an encapsulation bleed stop groove around the curved upper surface. The encapsulation bleed stop groove may be spaced inwardly from outermost edges of the lens, and may be configured to capture an overflow of resin during an overmolding process.

The electronic device may also include a transparent body within the first encapsulation opening. The encapsulation material, transparent body, and uppermost portions of the lens may be aligned flush with one another and may look like a standard land grid array (LGA) that is easy to handle at test and include surface mount technology (SMT).

In addition, the first and second encapsulation openings may be in spaced relation, and the encapsulation material therebetween may be optically opaque to form a light barrier. The electronic device may also include an optical emitter associated with the second encapsulation opening and directed into the lens. The IC may include circuitry thereon cooperating with the first and second optical receiving areas and the optical emitter to define a proximity sensor. In addition, a plurality of contacts may be carried by the first face of said circuit board surrounding said IC.

Another aspect is directed to a method of fabricating an electronic device including forming a circuit board having first and second faces and having first and second board openings therethrough. The method may also include coupling an integrated circuit (IC) to the first face of the circuit board and include first and second optical receiving areas aligned with the first and second board openings, respectively. In addition, the method may include forming an encapsulation material onto the second face of the circuit board and having first and second encapsulation openings therethrough aligned with the first and second board openings, respectively, and with a lens within the second board opening and second encapsulation opening, the lens having a curved upper surface and an encapsulation bleed stop groove around the curved upper surface. The method may also include coupling a transparent body within the first encapsulation opening, where the encapsulation material, transparent body, and uppermost portions of the lens are aligned flush with one another. The method may include associating an optical emitter with the second encapsulation opening and directed into the lens, and coupling the IC to the first and second optical receiving areas and the optical emitter to define a proximity sensor.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
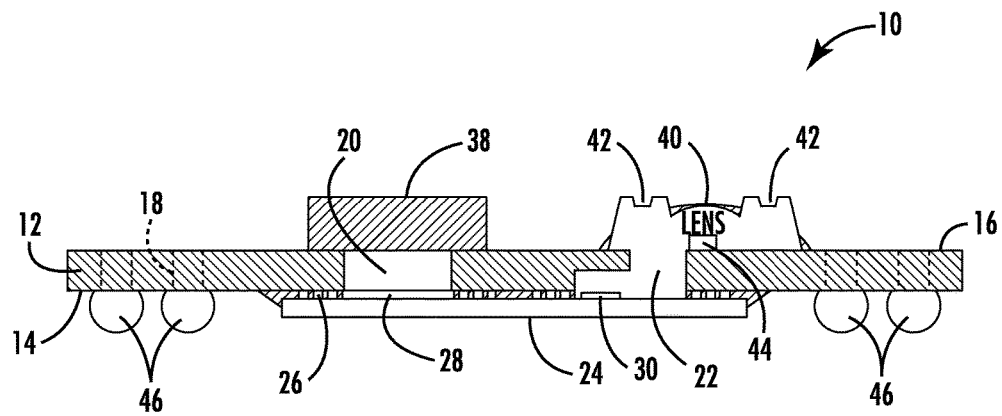
FIG. 1 is an elevational view before overmolding of an electronic device.

As illustrated in FIG. 1, an electronic device 10 may include a substrate (e.g., a circuit board) 12, for example. The circuit board 12 includes opposing first and second faces 14 and 16 and may include electrically insulating material as would be appreciated by those skilled in the art.

An integrated electrical connection network 18 of the circuit board 12 is configured for making the electrical connections from one face of the circuit board 12 to the other.

The circuit board 12 also includes first and second board openings 20 and 22, which pass directly through the circuit board 12 from the first face 14 to the second face 16.

An integrated circuit 24 may be coupled to the first face 14 of the circuit board 12 by way of a plurality of electrical connection elements 26, which ensures electrical connection between the integrated circuit 24 and the electrical connection network 18. The integrated circuit 24 may also include first and second optical receiving areas (or optical sensors) 28 and 30 aligned with the spaced apart first and second board openings 20 and 22, respectively.

Figure 2:
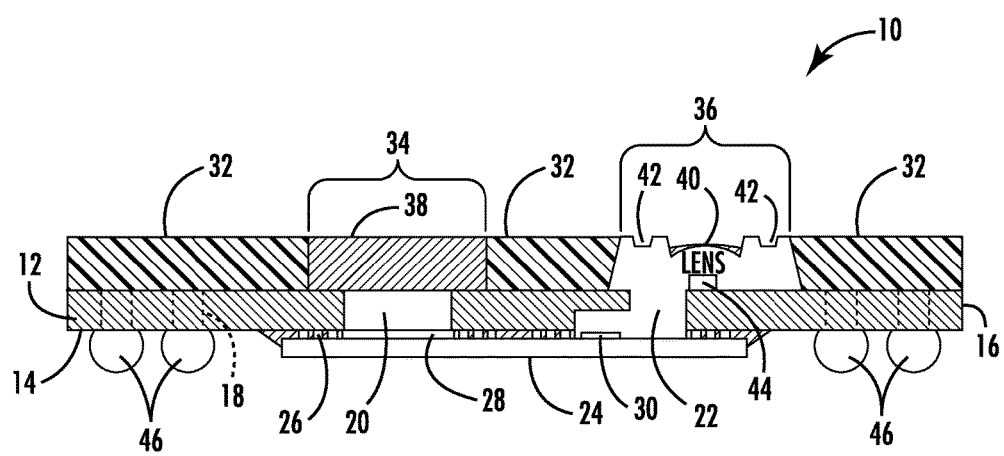
FIG. 2 is an elevational view after overmolding of the electronic device of FIG. 1.

Referring now also to FIG. 2, the electronic device 10 may include an encapsulation material 32 coupled to the second face 16 of the circuit board 12 and include first and second encapsulation openings 34 and 36 therethrough, which are aligned with the first and second board openings 20 and 22, respectively. The first and second encapsulation openings 34 and 36 may be in spaced relation to each other, with the encapsulation material 32 therebetween being optically opaque to form a light barrier. On the second face 16 of the circuit board 12 is fixed, for example by gluing, a transparent body 38, for example made of glass, within the first encapsulating opening 34 and which covers the first board opening 20 and may be larger than the latter.

Figure 3:
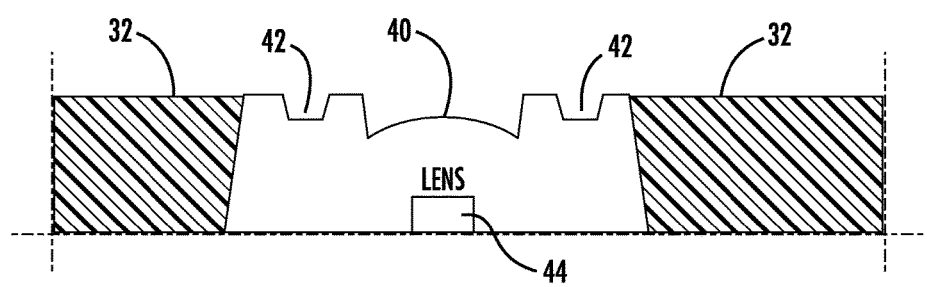
FIG. 3 is a detailed view of a lens and encapsulation bleed stop groove of the electronic device of FIG. 2.

The electronic device 10 may include a lens 40 within the second board opening 22 and second encapsulation opening 36. The lens 40 may have a curved upper surface. The lens 40 may also include an encapsulation bleed stop groove 42 around the upper surface as best shown in FIG. 3. The encapsulation bleed stop groove 42 may be spaced inwardly from outermost edges of the lens 40.

In addition, the electronic device 10 may also include an optical emitter 44 which is mounted, for example by gluing, on the second face 16 of the circuit board 12, and associated with the second encapsulation opening 36 and directed into the lens 40. The integrated circuit 24 includes circuitry thereon cooperating with the first and second optical receiving areas (or optical sensors) 28 and 30 and the optical emitter 44 to define the proximity sensor. The encapsulation material 32, transparent body 38, and uppermost portions of the lens 40 may be aligned flush with one another.

To electrically link the electronic package 10 to another component, the first face 14 of the circuit board 12 may be provided with a plurality of metallic electrical connection contacts 46, such as balls, placed on rear bump contacts of the integrated electrical connection network 18 and surrounding the integrated circuit 24.

Figure 4:
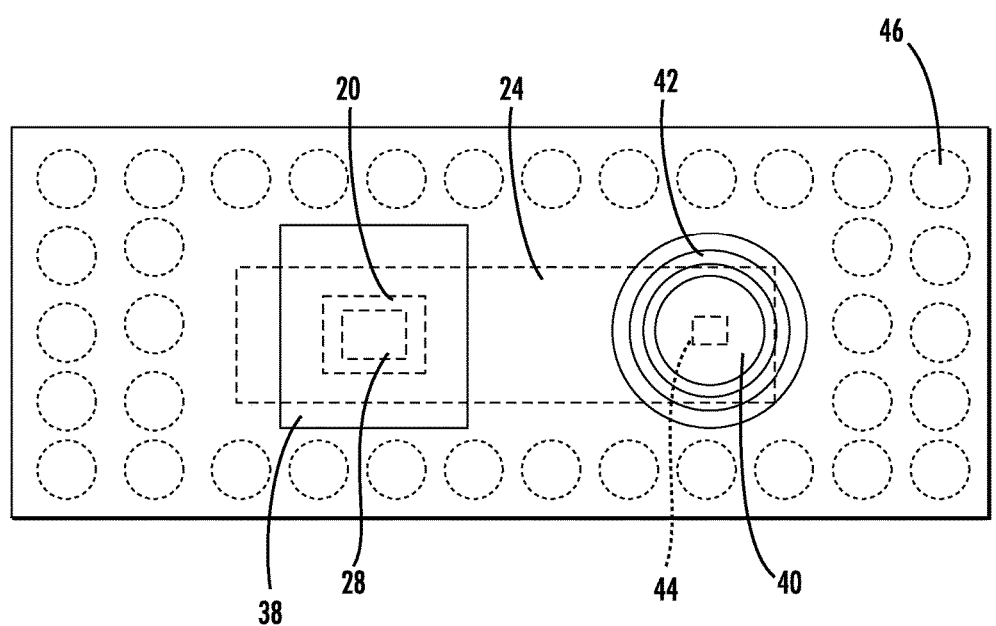
FIG. 4 is a top view of the electronic device of FIG. 2.

Referring now to FIG. 4, according to a particular exemplary embodiment, the circuit board 12 is rectangular and the integrated circuit 24 is also rectangular and extends longitudinally along the longitudinal axis of the circuit board 12. The optical receiving areas (or optical sensors) 28 and 30 may be placed along the longitudinal axis of the circuit board 12.

In operation, light radiation may be emitted by the optical emitter 44 into the lens 40, which is diffused towards the outside through the lens 40. The light radiation, which is diffused in the material of the lens 40, also reaches the second receiving area 30 aligned with the second opening 22 of the circuit board 12. The first optical receiving area 28 receives the outside light radiation through the transparent block 38.

Thus, the second optical receiving area 30 receives light radiation mostly from the optical emitter 44 and secondarily from the outside through the second opening 22 of the circuit board 12, the signal from the second optical receiving area 30 being able to form a reference for the analysis of the signal from the first optical receiving area 28. The result of the above is that the electronic device 10 can be used as a proximity sensor.

The electronic device 10 may be obtained from collective fabrication. For example, the electronic device may be fabricated using a substrate having first and second faces, and having a plurality of adjacent placements established according to a matrix and corresponding to a plurality of circuit boards 12 to be produced, as would be appreciated by those skilled in the art. In each circuit board 12 of the matrix, an integrated electrical connection network 18 may be provided. A first opening 20 and a second opening 22 may be made in each circuit board 12, at locations such that the optical receiving areas 28 and 30 can be located as described previously and may be produced by a drilling operation.

Next, an integrated circuit 24 having the optical receiving areas 28 and 30, may be installed in each circuit board 12, in the position described previously, by setting in place the electrical connection elements 26. A transparent block 38, a lens 40 having an encapsulation bleed stop groove 42 and optical emitter 44, is mounted to each circuit board 12 and the electrical connections are installed, as would be appreciated by those skilled in the art. Generally, the various fabrication steps described can be obtained by implementing the conventional means used in the microelectronics field.

Next, an overmolding process is used to couple the encapsulation material 32 to the second face 16 of the circuit board 12. As the lens 40 may have a recessed curved upper surface and an encapsulation bleed stop groove 42, this allows to overmold with film assist and prevent resin flash. In particular, the encapsulation bleed stop groove 42 prevents resin bleed during the overmolding process onto the upper surface of the lens 40. The electronic device 10 may have an appearance of a standard land grid array (LGA), easy to handle at test and with surface-mount technology (SMT). In addition, the overmolding process can be accomplished without the use of a cover or caps mounted to the surface of the circuit board 12.

The electronic device 10 which has been described could be installed inside the jacket or the shell of a portable or mobile telephone having openings facing the first and second openings 20 and 22 so as to face the optical emitter 44 and optical receiving area 28, so as to form a proximity sensor suitable for detecting the presence or absence of an object or of a part of the human body, in order to generate a particular command in the electronic circuits of the telephone.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
   a substrate;
   a first optical sensor coupled to the substrate;
   an optical emitter coupled to the substrate;
   a lens aligned with the optical emitter, the lens having a curved upper surface and an encapsulation bleed stop groove around the curved upper surface, and the encapsulation bleed stop groove extending above the curved upper surface, wherein the encapsulation bleed stop groove comprises a bottom surface and an end surface, the end surface of the encapsulation bleed stop groove disposed between the bottom surface of the encapsulation bleed stop groove and the curved upper surface, the end surface of the encapsulation bleed stop groove disposed above the bottom surface of the encapsulation bleed stop groove; and an encapsulation material coupled to the substrate, the encapsulation material having first and second encapsulation openings therethrough aligned with the first optical sensor and the lens, respectively.

2. The electronic device of claim 1, further comprising a transparent body within the first encapsulation opening.

3. The electronic device of claim 2, wherein the encapsulation material, transparent body, and uppermost portions of the lens are aligned flush with one another.

4. The electronic device of claim 1, wherein the first and second encapsulation openings are in spaced relation and encapsulation material therebetween is optically opaque.

5. The electronic device of claim 1, wherein the encapsulation bleed stop groove is spaced inwardly from outermost edges of the lens.

6. The electronic device of claim 1, wherein the encapsulation bleed stop groove comprises a side wall that is parallel to an outermost wall of the lens.

7. An electronic device comprising:
a circuit board having first and second faces and having first and second board openings therethrough;
an integrated circuit (IC) coupled to the first face of the circuit board and comprising first and second optical receiving areas aligned with the first and second board openings, respectively;
an encapsulation material coupled to the second face of the circuit board and having first and second encapsulation openings therethrough aligned with the first and second board openings, respectively; and
a lens within the second board opening and second encapsulation opening and having a curved upper surface and an encapsulation bleed stop groove around the curved upper surface, and the encapsulation bleed stop groove extending above the curved upper surface, wherein the encapsulation bleed stop groove comprises a bottom surface having a first distance to the second face of the circuit board and an end surface disposed between the bottom surface of the encapsulation bleed stop groove and the curved upper surface, the end surface of the encapsulation bleed stop groove having a second distance to the second face of the circuit board, the second distance being larger than the first distance.

8. The electronic device of claim 7, further comprising a transparent body within the first encapsulation opening.

9. The electronic device of claim 7, wherein the encapsulation material, transparent body, and uppermost portions of the lens are aligned flush with one another.

10. The electronic device of claim 7, wherein the encapsulation bleed stop groove is spaced inwardly from outermost edges of the lens.

11. The electronic device of claim 7, wherein the first and second encapsulation openings are in spaced relation and encapsulation material therebetween is optically opaque.

12. The electronic device of claim 7, further comprising an optical emitter associated with the second encapsulation opening and directed into the lens.

13. The electronic device of claim 12, wherein the IC comprises circuitry thereon cooperating with the first and second optical receiving areas and the optical emitter to define a proximity sensor.

14. The electronic device of claim 7, further comprising a plurality of contacts carried by the first face of the circuit board surrounding the IC.

15. The electronic device of claim 7, wherein the lens comprises slanted outermost walls.

16. A method of fabricating an electronic device comprising:
forming a circuit board having first and second faces and having first and second board openings therethrough;
coupling an integrated circuit (IC) to the first face of the circuit board and comprising first and second optical receiving areas aligned with the first and second board openings, respectively; and
forming an encapsulation material onto the second face of the circuit board and having first and second encapsulation openings therethrough aligned with the first and second board openings, respectively, and with a lens within the second board opening and second encapsulation opening, the lens having a curved upper surface and an encapsulation bleed stop groove around the curved upper surface, and the encapsulation bleed stop groove extending above the curved upper surface of the lens, wherein the encapsulation bleed stop groove comprises a bottom surface and an end surface, the end surface of the encapsulation bleed stop groove disposed between the bottom surface of the encapsulation bleed stop groove and the curved upper surface, the end surface of the encapsulation bleed stop groove disposed above the bottom surface of the encapsulation bleed stop groove.

17. The method of claim 16, further comprising coupling a transparent body within the first encapsulation opening.

18. The method of claim 17, wherein the encapsulation material, transparent body, and uppermost portions of the lens are aligned flush with one another.

19. The method of claim 16, wherein the encapsulation bleed stop groove is spaced inwardly from outermost edges of the lens.

20. The method of claim 16, wherein the first and second encapsulation openings are in spaced relation and encapsulation material therebetween is optically opaque.

21. The method of claim 16, further comprising associating an optical emitter with the second encapsulation opening and directed into the lens.

22. The method of claim 21, further comprising coupling the IC to the first and second optical receiving areas and the optical emitter to define a proximity sensor.

23. The method of claim 16, further comprising preventing resin bleed onto the curved upper surface of the lens during an overmolding process using the encapsulation bleed stop groove.

* * * * *